United States Patent [19]

Freeman

[11] Patent Number: 4,987,494

[45] Date of Patent: Jan. 22, 1991

[54] SYSTEM FOR PARALLEL TRANSFER BETWEEN CCD ARRAYS

[75] Inventor: Charles F. Freeman, Springfield, Va.

[73] Assignee: The United States of America as represented by the Secretary of the Army, Washington, D.C.

[21] Appl. No.: 447,481

[22] Filed: Dec. 7, 1989

[51] Int. Cl.$^5$ .................... H04N 3/14; H04N 5/335; H01L 29/78
[52] U.S. Cl. .................... 358/213.11; 358/213.25; 358/213.31; 358/213.27; 358/213.12; 357/24
[58] Field of Search .................... 358/213.31, 213.26, 358/213.27, 213.11, 482, 213.25; 357/24

[56] References Cited

U.S. PATENT DOCUMENTS

| | | | |
|---|---|---|---|
| 4,348,611 | 9/1982 | Ruppel et al. | 358/213.11 |
| 4,592,029 | 5/1986 | Altmann et al. | 358/213.11 |
| 4,771,183 | 9/1988 | McGlynn | 358/213.11 |

Primary Examiner—James J. Groody
Assistant Examiner—Wendy R. Greening
Attorney, Agent, or Firm—Milton W. Lee; John E. Holford; Anthony T. Lane

[57] ABSTRACT

The invention provides a composite CCD storage chip, i.e. a chip with two CCD's or equivalent charge packet storage devices mounted on opposite sides of the same chip, wherein the charge packets are transferred in parallel through the small dimension of the chip using central boundary layers.

10 Claims, 4 Drawing Sheets

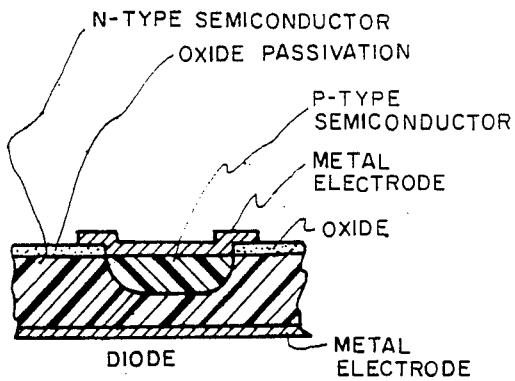
FIG. 1a — DIODE
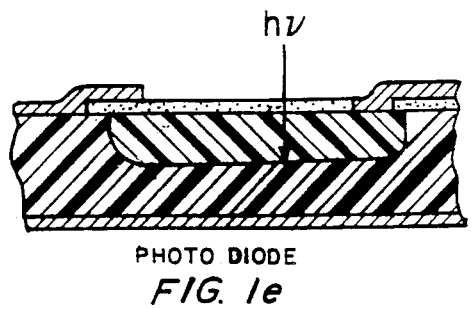
FIG. 1e — PHOTO DIODE
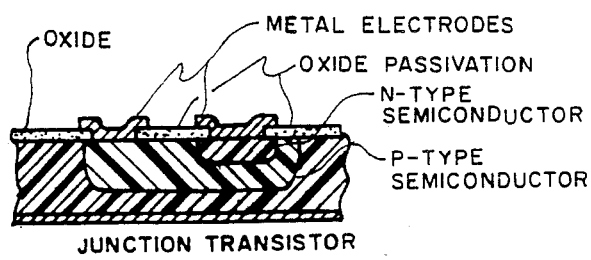
FIG. 1b — JUNCTION TRANSISTOR
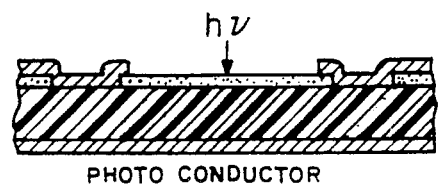
FIG. 1f — PHOTO CONDUCTOR
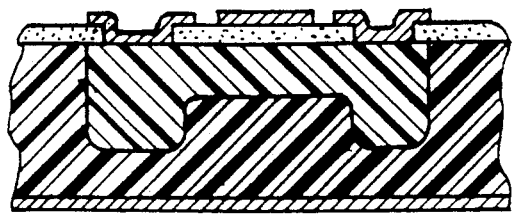
FIG. 1c — MOS P-CHANNEL FET
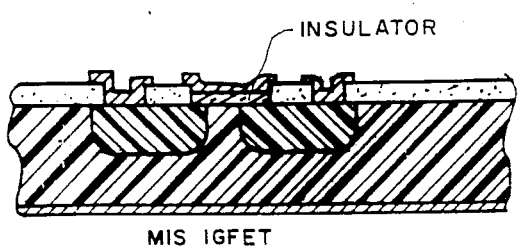
FIG. 1d — MIS IGFET U.S. Patent   Jan. 22, 1991   Sheet 4 of 4   4,987,494

— PRIOR ART — ns SYSTEM FOR PARALLEL TRANSFER BETWEEN
CCD ARRAYS

The invention described herein may be manufactured, used, and licensed by the U.S. Government for governmental purposes without the payment of any royalties thereon.

BACKGROUND OF THE INVENTION

1. Field of the Invention

The invention relates to charge-coupled-devices (CCD's) and related devices such as imagers with arrays of photodiodes or photoconductors, charge-injection-devices (CID's) and charge-transfer-devices (CTD's).

2. Prior Art

CCD's fill a special need in the computer field due to their unique combination of memory density, access time and cost. When used in their digital mode they require essentially only one simple electrode per bit and very little processing of the substrate to provide excellent dynamic shift registers. In their analog mode they occupy an even more unique position. They have become indispensible in the field of electronic imaging where they are used extensively in hand-held TV type image cameras. In this mode they are known as bucket-brigade devices and require somewhat more sophisticated processing to preserve the relative integrity of the charge packets. In either mode they provide precise delay lines in clocked circuitry having a sufficiently high clock frequency. Examples of the devices, mentioned above, are found in the "ELECTRONICS ENGINEERS' HANDBOOK", 2nd ed., by Fink and Christiansen, copyright 1982, the "ENCYCLOPEDIA OF SCIENCE AND TECHNOLOGY," published by McGraw-Hill, Copyright 1982 and "ADVANCES IN ELECTRONICS AND ELECTRON PHYSICS", Sequin, C. H., and M. F. Tompsett.

The format of CCD's and similar devices make them extremely useful in processing the data they store. Each packet represents a bit in the digital mode or a pixel in the analog mode, each of which can be processed separately, if desired. When this signal processing involves a number of steps, it often becomes necessary to transfer the packets to another CCD to make additional chip real estate available for processing circuits or to avoid interference with the flow of data. An object of the present invention is to provide a unique and extremely useful structure on a single chip that provides such a transfer in the fastest possible mode.

SUMMARY OF THE INVENTION

The invention provides a novel combination of CCD and/or CID devices wherein a chip has at least one of these devices on each of its opposite surfaces. The chip itself is layered to provide complete isolation of the two devices in the absence of any bias between the electrodes of these devices. These same layers, however, can provide parallel transfer of some or all stored charge packets in one device to the other device when a suitable bias voltage is applied between the control electrodes of the two devices.

BRIEF DESCRIPTION OF THE DRAWINGS

The invention is best understood by reference to the accompanying drawings wherein:

FIGS. 1a through 1f show a number of different charge injection structures that can be used to introduce charge packets at various points in the charge coupled devices of FIG. 1.

DESCRIPTION OF THE PREFERRED DEVICES

Figure 1:
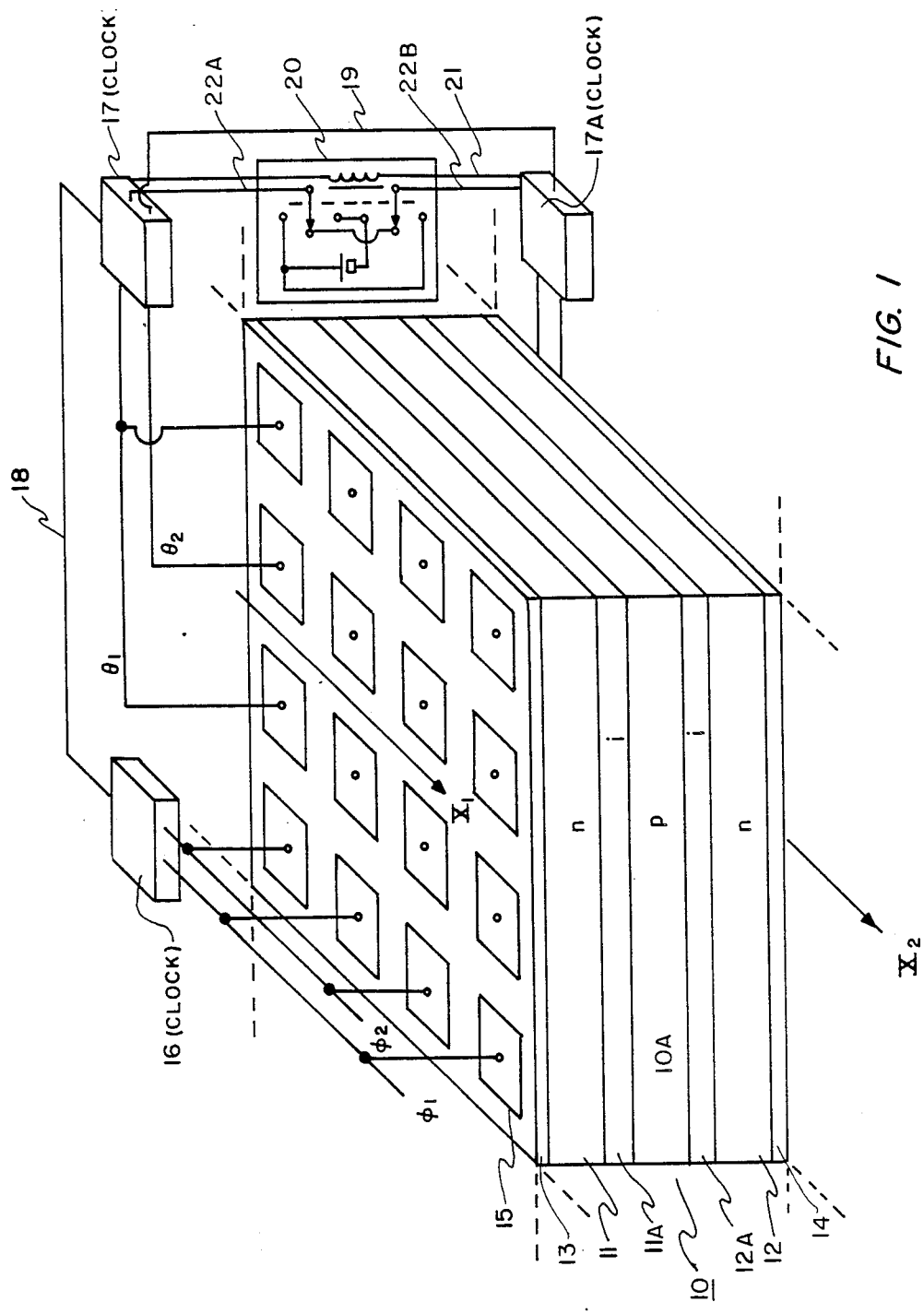
FIG. 1 shows a portion of a special chip incorporating two separate charge coupled devices with appropriate charge storage devices on opposite faces of the chip according to the present invention.

Referring to FIG. 1 there is shown the general structure of a center portion in one form of a CCD chip 10 according to the present invention. The semiconductor layers 11 and 12 nearest each surface have the same type charge carriers, e.g. n-type. The semiconductor can be any group IV, III-V, or II-VI material normally used for transistors or photodetectors. The central layer 10A of the device is formed of material of the opposite type, in this case p-type material. Between the n and p layers are formed thin layers 11A and 12A of intrinsic semiconductor, which provide a smoother transition through the p-n junctions. This permits a rapid flow of charge when these junctions are biased by the same bias electric field lines. As usual, the n-layers are coated with passivation layers 13 and 14, usually formed by depositing an oxide of the same semiconductor material. Generally all the layers will be made from the same semiconductor base materials, but bandgap variations and heterojunctions may be used as appropriate.

The charge storage devices 15 are formed on or through both passivation layers. They come in many forms. Perhaps the simplest being two electrodes of conducting material superposed on the passivation layer. The devices normally form an array of columns, rows or other signal paths according to desired function of the CCD. At least one device must be a charge injection (input) device (CID) and another must be a charge extraction (output) device. As shown in FIG. 1a either of these is most simply a diode formed by diffusing an opposite type dopant through an opening formed in the passivation layer into the underlying layer and depositing an electrode thereon. Alternatively, as shown in FIGS. 1b through 1f, respectively; these injection devices may take the form of junction transistors, MOS devices, MIS devices, photoelectric devices, photoconductive devices or other such structures. The materials involved in these structures are identified in the drawings and are well known in the art. The cross-hatching is consistant in this respect for FIGS. 1a-1f. As well known in the art the roles of n and p materials can be reversed in a complete integrated device. The devices shown are fairly representative, but many more elaborate arrangements can be found in the prior art, if desired. The remaining devices merely transfer the injected charge packet from an input to an output device.

The function of a specific structure is provided through periodically varying potentials applied to the various terminals. As is well understood in the art these potentials are supplied by clock pulse generators such as 16 and/or 17. The generators are usually intermittently and harmonically related (synchronized), as through the facial synch line 18, and usually supply two or more balanced phase output lines such as $\phi_1$ and $\phi_2$ or $\theta_1$ and $\theta_2$. With very simple electrodes three-phase lines provide unambiguous shifting of charge in one direction and reversing the phase order can provide a means of reversing this direction, if desired. Two-phase lines require special terminal geometry to control the direction of charge packet flow. A good design involves staircasing the passivation layer under each electrode, which is amenable to standard masking techniques used in their manufacture. Surface trapping of charge at the passivation layer is usually reduced in digital devices by a "fat zero" biasing technique and in analog devices by forming a "buried channel" in the semiconductor just below the passivation layer.

In applicants device separate clocks, like clock 17A, are preferred but not required for the devices on the opposite sides of the chip. These clocks can operate at different frequencies, but for proper charge transfer they must also be referenced or synchronized, as through transverse synch line 19, with all other clocks used. Applicant also provides a transverse bias means 20 controlled by the clocks, as through line 21, to apply either polarity of a transverse bias, as through lines 22A and 22B, between electrodes of corresponding charge storage devices on opposite sides of the chip. The bias means, as shown, is essentially a triple-pole double-throw relay and like the clocks can be easily translated into solid state elements that reside on the same or an adjacent chip. The neutral or center position maintains a zero bias between the clock signals.

Figure 2B:
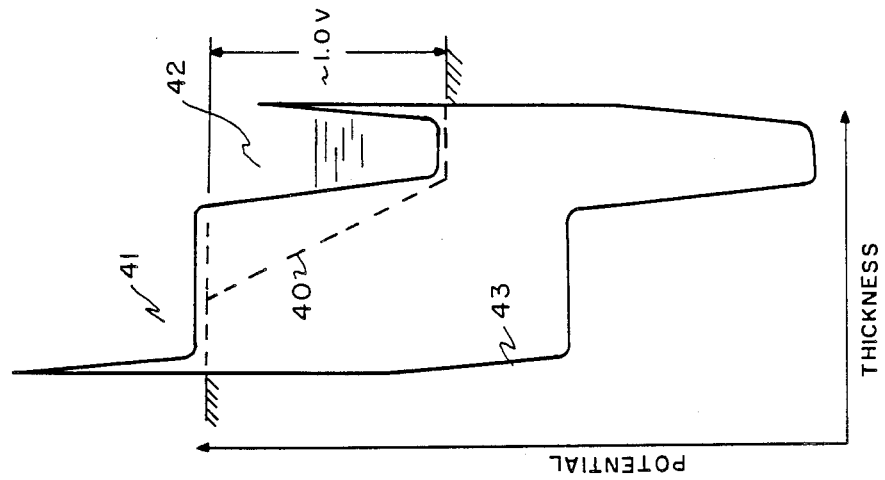
FIG. 2b shows the energy band diagram between the same devices with a one volt bias between the same electrodes.
Figure 2A:
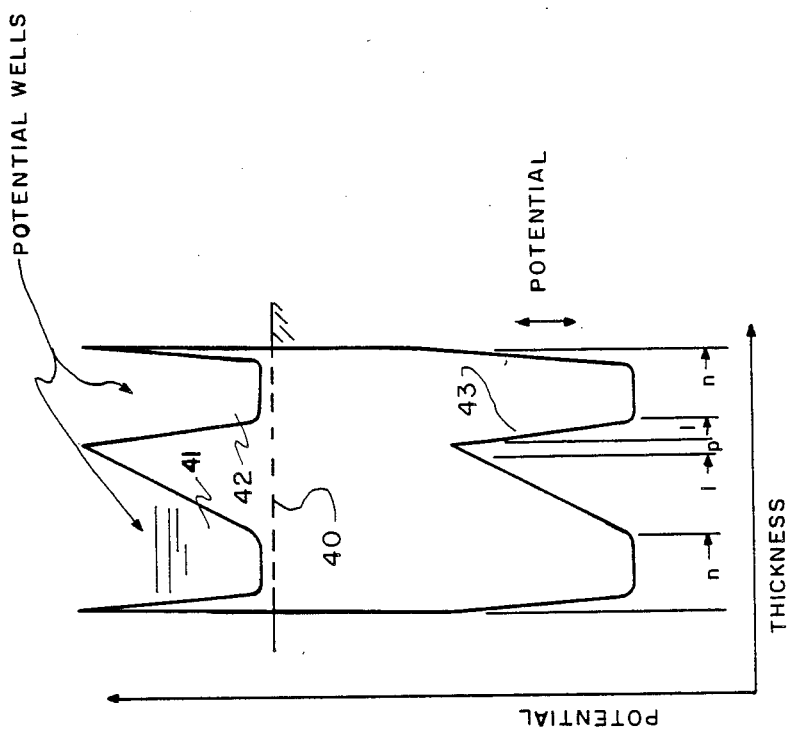
FIG. 2a shows the energy band diagram for the device of FIG. 1 with zero bias between the electrodes of the two separate devices.

FIGS. 2A and 2B show the energy band diagrams for the structure of FIG. 1 in the unbiased and biased conditions respectively. The upper energy level curve defines the charge wells 41 and 42 that exist on either side of the chip above the Fermi level 40. The lower curve 43 shows the potential profile across the chip. The i-p-i layers in the middle of the chip form a high barrier between the wells that peaks in the p-player. As shown in FIG. 2B a bias as small as one volt shifts the profile so that charge flows quickly from well 41 to well 42. Obviously, the opposite bias will produce the opposite result. When there is a preferred direction of flow then as from well 41 to 42 the thickness of the intrinsic layers can be unbalanced as shown to favor that flow with the thicker layer near the charge source.

Although only a few charge storage elements are shown in FIG. 1, the actual chips contain thousands of them. Information usually resides in groups of storage devices such as all or part of a row or column. A few systems access the devices in random fashion by sensing capacitance changes due to presence of a charge packet. Other systems, as indicated in FIG. 1, may first transfer all charge packets in every row one space using $\phi_1$ and $\phi_2$ to achieve a parallel transfer to a selected column (e.g. the left column shown) and serially empty the column using $\theta_1$ and $\theta_2$ before again shifting the rows. Perhaps the most popular device is the CCD imager. In this device each pixel of a TV type image is represented by one or more CIDs usually in the form of photodiodes. Since the charge forming layer is selected to be photosensitive the charge packet must be then immediately transferred to a safe storage area or an output device to avoid saturation or smearing.

Figure 3C:
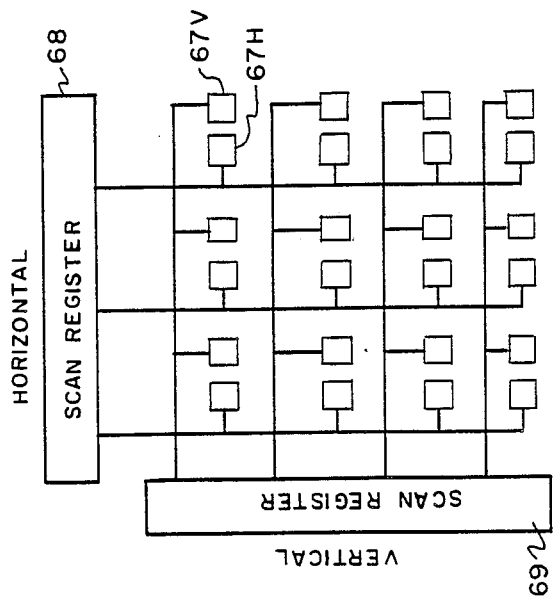
FIGS. 3a, 3b and 3c show prior art forms of imaging CCD's.
Figure 3B:
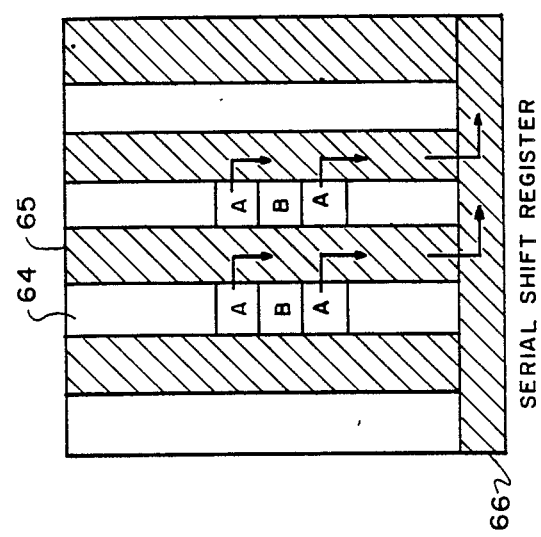
Figure 3A:
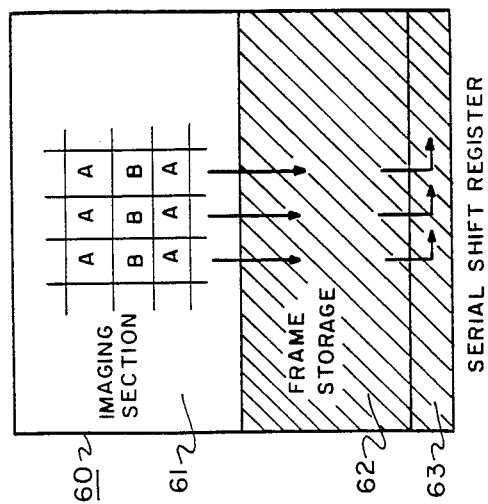

FIGS. 3A, 3B and 3C illustrate the three most popular prior art geometry schemes for imaging devices. In the imager 60 of FIG. 3A an imaging array 61 is located next to a frame storage area 62. In this imager the columns (or rows) of charge packets are quickly transferred serially into the frame storage area containing an equal number of storage devices. The packets in each row are then transferred in parallel to a shift register 63 and transferred serially to an output to produce a standard video signal. In this mode only frontside illumination is possible. Interlacing is obtained by integration under different electrodes in subsequent frames (A and B in the figure). Shaded regions are opaque.

In FIG. 3B each column of photodetectors 64 is located next to a column serial shift register 65. The charge packets of each column are shifted in parallel into the column register. A row shift register 66 then receives each row in parallel and transfers each row serially to an output device as in FIG. 3A. All shift registers are coated with opaque material.

FIG. 3C shows a charge-injection-device area imager. The electrodes 67V of a particular column are allowed to float, and the change in potential after a row transfer under that column from electrodes 67H provides the pixel signal readout. Area imaging is obtained by suitable scanning of the horizontal and vertical registers 68 and 69. The device has the advantage of random access and is also free of optical smearing effects. Transparent electrodes allow about 100% optically active areas with a sensitivity that depends on the readout scheme.

Imagers are becoming increasingly sophisticated. Techniques have been developed, using central processors, to improve contrast, supply missing detail and to combine image features obtained with visible and infrared. To achieve these ends much shifting between registers is required. This contracted processing strains the basic constraints of CCD's which is due to the short lifetime of the charge packets. The short parallel transfer period for all pixel packets at the same time maintains the quality of the pixels and greatly speeds processing time. In compact systems it also doubles the available real estate for integrated circuitry at no cost in space.

In manufacture the absence of a normal very thick substrate may present a problem. However, the chip can be partially manufactured on a heavy substrate and then completed by dissolving on abrading away the substrate to complete the substrate side of the chip. This technique has been successfully employed in the past. In digital devices the combinations of CTD's and CID's are endless. Reclusive mathematical processes should benefit immensely. Imagers can combine images made from different types of detectors or images can be processed at normal TV rates on one side of the chip and several times that rate on the opposite side of the chip.

I claim:

1. A composite multilayer CCD structure comprising:
   two monolayer CCD's formed on first and second layers with the same polarity type of doped semiconductor material each supporting an array of electrodes, at least one CID, and electronic clock means interconnecting said electrodes;
   a boundary layer including a third layer of doped semiconductor material of opposite polarity type joining said first and second layers such that at least some of said electrodes form normally opposing pairs through said layers; and
   said clock means including intermittent biasing means for applying sufficient potential between said opposing pairs of electrodes to cause charge to flow through said boundary layer.

2. A composite structure according to claim 1; further including:
a fourth layer on intrinsic semiconductor between said first and third layers.

3. A composite structure according to claim 2; further including a fifth layer of intrinsic semiconductor between said second and third layers.

4. A composite structure according to claim 1; wherein:
said CID is a junction device.

5. A composite structure according to claim 1; wherein:
said CID is a MOS device.

6. A composite structure according to claim 1; wherein:
said CID is a MIS device.

7. A composite structure according to claim 1; wherein:
said CID is a photoconductor.

8. A composite structure according to claim 1; wherein:
said CID is a photodiode.

9. A composite structure according to claim 1; wherein:
at least one of said monolayer CCD's is an imaging device.

10. A composite structure according to claim 1; wherein:
both of said monolayer CCD's are imaging devices.

* * * * *